United States Patent [19]

You et al.

[11] Patent Number: 5,760,480

[45] Date of Patent: Jun. 2, 1998

[54] LOW RC INTERCONNECTION

[75] Inventors: Lu You, Santa Clara; Robin W. Cheung, Cupertino; Simon S. Chan, Saratoga; Richard J. Huang, Milpitas, all of Calif.

[73] Assignee: Advanced Micro Devices, Inc., Sunnyvale, Calif.

[21] Appl. No.: 530,658

[22] Filed: Sep. 20, 1995

[51] Int. Cl.$^6$ .................. B29B 13/00; H01L 21/283; B05D 3/02

[52] U.S. Cl. .................. 257/783; 257/643; 257/642; 257/759; 257/753

[58] Field of Search .................. 257/783, 642, 257/643, 762, 759, 753

[56] References Cited

U.S. PATENT DOCUMENTS

| | | | |
|---|---|---|---|
| 4,720,424 | 1/1988 | Eickman et al. | 257/788 |
| 5,091,251 | 2/1992 | Sakumoto et al. | 257/668 |
| 5,114,754 | 5/1992 | Cronin et al. | 257/643 |
| 5,114,757 | 5/1992 | Linde et al. | 257/632 |
| 5,196,103 | 3/1993 | Tou et al. | 204/192.34 |
| 5,324,591 | 6/1994 | Georger, Jr. et al. | 437/4 |
| 5,397,741 | 3/1995 | O'Connor et al. | 437/187 |

FOREIGN PATENT DOCUMENTS

0618617 A2  10/1994  European Pat. Off.

OTHER PUBLICATIONS

Singer, "New Interconnect Materials: Chasing the Promise of Faster Chips," Semiconductor International, Nov., 1994, pp. 52, 54 and 56.

Adema et al., "Passivation Schemes for Copper/Polymer Thin-Film Interconnections Used in Multichip Modules," IEEE Transactions on Components, Hybrids, and Manufacturing Technology, vol. 16, No. 1, Feb. 1993, pp. 53-58.

Primary Examiner—Wael Fahmy
Assistant Examiner—Alexander Oscar Williams

[57] ABSTRACT

A low RC delay interconnection pattern is formed with a low resistivity metal, such as copper, and a low dielectric constant material, such as organic polymers. An intermediate bonding layer is formed between the low resistivity metal and low dielectric constant material employing an adhesion promoter, such as a silane-based adhesion promoter. The adhesion promoter can be applied between the metal and dielectric layers or incorporated in the dielectric layer.

6 Claims, 1 Drawing Sheet

LOW RC INTERCONNECTION

TECHNICAL FIELD

The present invention relates to a semiconductor device having a low RC interconnection pattern, and to a method of manufacturing the semiconductor device. The invention has particular application in submicron IC manufacturing.

BACKGROUND ART

The escalating requirements for high density and performance associated with ultra large scale integration semiconductor wiring require responsive changes in interconnection technology, which is considered one of the most demanding aspects of ultra large scale integration technology. In addition, high performance microprocessor applications require rapid switching speed of semiconductor circuitry. The speed of semiconductor circuitry varies inversely with the resistance of the metal layer and inversely with the capacitance of the dielectric layer forming the interconnection pattern. As integrated circuits become more complex and the feature size and spacing become smaller, the speed of the integrated circuit becomes increasingly dependent on the capacitance and resistance of the interconnection pattern.

Prior efforts to increase the speed of semiconductor circuitry focused upon reducing the dielectric constant of material conventionally employed in forming dielectric interlayers. Silicon dioxide, the dielectric material conventionally employed in forming dielectric interlayers, has a dielectric constant of about 4. Prior efforts involve the development of materials having a lower dielectric constant than silicon dioxide, such as low dielectric constant polymers, teflon, aerogels and porous polymers.

It would be advantageous to employ such low dielectric constant polymers in combination with low resistivity metals, such as copper, silver, gold, and alloys thereof, in forming interconnection patterns. The combination of a low resistivity metal and low dielectric constant polymer would be expected to reduce resistance capacitance (RC) time delays. See, for example, Singer, "New Interconnect Materials: Chasing the Promise of Faster Chips," Semiconductor International, November, 1994, pp. 52, 54 and 56; and Adema et al., "Passivation Schemes for Copper/Polymer Thin-Film Interconnections Used in Multichip Modules," IEEE Transactions on Components, Hybrids, and Manufacturing Technology, Vol. 16, No. 1, February 1993, pp. 53–58.

However, the formation of a new reliable interconnection pattern comprising a low resistivity metal and low dielectric constant material is problematic in various respects. For example, aluminum, the interconnection metal of choice, inherently forms a passivation layer which protects aluminum from corrosion. However, low resistivity metals, such as copper, do not form a self-passivating layer. Moreover, copper ions rapidly diffuse through silicon causing damage to semiconductor components. In addition, most low dielectric constant polymers do not adequately adhere to metals. Accordingly, any attempt to form an interconnection pattern employing a low resistivity metal, such as copper, and a low dielectric constant polymer, would require the separate formation of a barrier/passivation layer to protect the metal layer from corrosion and prevent the diffusion of metal ions. In addition, a separate adhesion layer would be required. Such an interconnection pattern, manufactured by a damascene process, is schematically depicted in FIG. 1, and comprises a dielectric layer 10, which can be a low dielectric polymer, and a low dielectric constant polymer layer 11 formed thereon. The depicted interconnection pattern further comprises a low resistivity metal layer 12 comprising, for example, copper. In order to utilize a metal such as copper, barrier/passivation layer 13 is required, in addition to adhesion layer 14. Suitable barrier/passivation materials would include titanium, titanium nitride, tantalum, tantalum nitride, chromium, silicon nitride and silicon dioxide. The formation of such barrier/passivation layers, and separate adhesion layers, requires additional costly equipment, manipulative steps and materials, thereby decreasing throughput, increasing cost and further complicating the manufacturing process.

There exists a need for a simplified, cost effective technique to form an interconnection pattern comprising a low dielectric constant material and a low resistivity metal, such as copper, without forming separate barrier/passivation layers.

DISCLOSURE OF THE INVENTION

An object of the present invention is a highly integrated semiconductor device exhibiting reduced RC delay, a high operating speed and improved signal-to-noise ratio.

Another object of the present invention is a method of producing a semiconductor device exhibiting reduced RC delay, a high operating speed and an improved signal to noise ratio.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising a dielectric layer; a metal layer; and an intermediate bonding layer between the metal pattern and dielectric layer; wherein the metal layer is bonded to the dielectric layer through the intermediate bonding layer.

Another aspect of the present invention is a method of manufacturing a semiconductor device having an interconnection pattern, which method comprises bonding a metal layer to a dielectric layer employing an adhesion promoter to form an intermediate bonding layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
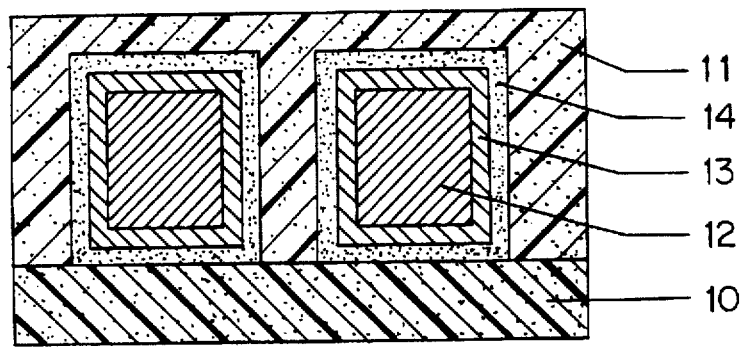
FIG. 1 schematically depicts a cross-section of an interconnection pattern comprising barrier/passivation layers.

The present invention addresses and solves problems of conventional semiconductor devices attributed to a high RC interconnection pattern, such as low operating speeds and low signal-to-noise ratios, particularly in highly integrated circuits with submicron technology. The present invention provides an improved semiconductor device having a low RC interconnection pattern and improved signal-to-noise ratio by an efficient, simplified, cost effective manufacturing technique.

The dependence of integrated circuit speed on the RC delay of an interconnection pattern requires a reduction in the resistance and capacitance of an interconnection pattern. It is, therefore, desirable to form an interconnection pattern employing a low resistivity metal, such as silver, copper, gold and alloys thereof, in combination with low dielectric constant materials, such as low dielectric constant polymers. It is particularly advantageous to form a low RC interconnection pattern comprising a low resistivity metal, such as copper, and a low dielectric polymer, by a simplified technique without the need to form separate barrier/passivation layers and separate adhesion layers, thereby avoiding the expenditure of resources attendant upon providing additional equipment and performing additional manufacturing steps.

The present invention provides a simplified, cost effective method of forming a low RC interconnection pattern comprising a low resistivity metal, such as copper, and a low dielectric polymer, without the application of separate barrier/passivation layers and without the separate application of adhesion layers, and the attendant disadvantages thereof. In accordance with the present invention, a low resistivity metal, e.g., copper, and low dielectric constant material, e.g., a low dielectric constant polymer, are bonded to each other through an intermediate bonding layer. Preferably, an adhesion promoter is employed to form the intermediate bonding layer. Such an adhesion promoter can be applied to the interface between copper and low dielectric constant polymer, as by application to the surface of the copper layer and/or surface of the dielectric layer. In another embodiment, the adhesion promoter is blended with the low dielectric constant polymer.

While not wishing to be bound to any particular theory, it is believed that the adhesion promoter undergoes a chemical reaction with the surface of the low resistivity metal forming metal-oxygen-carbon bonds, thereby bonding the metal to the low dielectric constant polymer through an intermediate bonding layer. The resulting intermediate bonding layer passivates and effectively seals the metal layer inside the dielectric layer. In addition, the intermediate bonding layer serves as a diffusion barrier, preventing diffusion of the low resistivity metal, such as copper, through the semiconductor device.

Thus, in accordance with the present invention, the semiconductor device manufacturing process is significantly simplified in a cost effective manner while increasing interconnection reliability vis-à-vis conventional techniques. The tools involved are relatively inexpensive. It is a particular advantage of the present invention that the metal lines can be formed by employing damascene or non-damascene processes, such as conventional etch back techniques. The use of an adhesion promoter in accordance with the present invention advantageously avoids the disadvantages attendant upon forming separate barrier/passivation layers and separate adhesion layers.

In accordance with the present invention, any of various commercially available adhesion promoters can be employed, such as silane-based organic adhesion promoters. Suitable commercially available silane-based adhesion promoter include 3-APS (3-aminopropyltriethoxysilane) or MOPS (3-methacryloxypropyltrimethoxysilane). Other commercially available silane-adhesion promoters containing vinyl, chloropropyl, epoxy, diamine, mercapto and/or cationic styryl organofunctional groups can be employed.

In accordance with the present invention, any low resistivity metal can be employed in forming the low RC interconnection pattern. Such low resistivity metals include copper, copper-based alloys, gold, gold-based alloys, silver, silver-based alloys, preferably copper and copper-based alloys. The low dielectric constant material employed in the present invention can be any available low dielectric constant material, such as low dielectric constant polymers. Examples of such commercially available low dielectric constant polymers include Dow Chemical DVS-BCB (which exhibits a dielectric constant of about 2.7), DuPont Polyimides (which exhibit dielectric constants about 3.0), Teflons (which exhibit a dielectric constant of about 1.8 to about 2.1), AlliedSignal FLARE (which exhibits a dielectric constant of about 2.6), Silsesquioxanes (which exhibits a dielectric constant of about 3.0) and Union Carbide Parylenes (which exhibit a dielectric constant of about 2.3 to about 3.1).

Notwithstanding the typical weak adhesion of polymers to metals, in accordance with the present invention low dielectric constant polymers are reliably bonded to low resistivity metals, such as copper, to form reliable low RC interconnection patterns employing an adhesion promoter, preferably a silane-based adhesion promoter. The present invention is suitably adopted for submicron technology, including technology with a design rule of about 0.18 microns and below. The present invention advantageously involves fewer processing steps at a low cost with no additional equipment and is compatible with damascene and non-damascene techniques employing commercially available materials.

Figure 2:
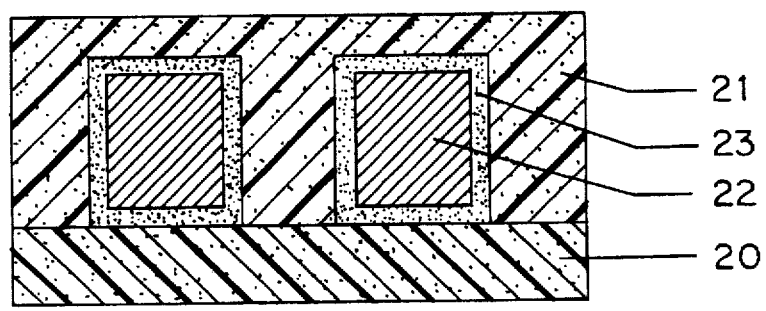
FIG. 2 schematically depicts a cross-section of an interconnection pattern in accordance with the present invention.

The present invention is illustrated in FIG. 2, wherein there is illustrated a section of an interconnection pattern manufactured by a damascene process comprising a low dielectric constant polymer layer 21 on a dielectric layer 20, which can also comprise a low dielectric constant polymer. The depicted section of an interconnection pattern comprises a low dielectric constant polymer 21 bonded to a low resistivity metal 22, such as copper, through an intermediate bonding layer 23. Intermediate bonding layer 23 is formed by employing an adhesion promoter, preferably a silane-based organic adhesion promoter, which can be applied to the interface between the low resistivity metal 22 and low dielectric constant polymer 21, as by applying it to either or both surfaces thereof. Alternatively, the adhesion polymer can be blended with the low dielectric constant polymer 21 before deposition.

In manufacturing a semiconductor device in accordance with the present invention, conventional photolithographic, etching and deposition techniques can be employed. In carrying out the various embodiments of the present invention, conventional metallization techniques can be employed for the deposition of conductive layers and interconnection lines, such as various types of chemical vapor deposition (CVD) processes, including low pressure chemical vapor deposition (LPCVD), and plasma enhanced chemical vapor deposition (PECVD). The various layers are planarized by known planarization techniques, such as etching and chemical-mechanical polishing techniques.

The various embodiments of the present invention may comprise damascene techniques, such as single and dual damascene techniques. In dual damascene techniques, vias and trenches are simultaneously filled with low resistivity metals, such as copper, copper-based alloys, gold, gold-based alloys, silver and silver-based alloys, preferably copper and copper-based alloys.

In accordance with the present invention, semiconductor devices are provided with low RC interconnection pattern and, hence, exhibit higher operating speeds, and improved signal-to-noise ratio. Such improved semiconductor devices are manufactured by an efficient, simplified technique without the disadvantages attendant upon forming separate barrier/passivation layers and separate adhesion layers, employing conventional equipment and materials in a cost effective manner. Thus, in accordance with the present invention, a low RC interconnection pattern is formed comprising a low resistive metal, such as copper, and a low dielectric constant polymer, by forming an intermediate bonding layer between the low resistivity metal and a low dielectric constant polymer, preferably employing a commercially available adhesion promoter, such as a silane-based promoter, which reacts with the surface of the low resistivity metal effecting bonding to the low dielectric constant polymer, thereby sealing the low resistivity metal within the low dielectric constant polymer. The disclosed embodiments and concepts of the present invention enjoy utility in any type of semiconductor device wherein interconnection patterns are formed.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A semiconductor device comprising:

a layer of dielectric material;

a metal interconnect pattern; and an intermediate layer completely surrounding the metal interconnect pattern; wherein the metal is bonded to the dielectric material by the intermediate layer.

2. The semiconductor device according to claim 1, wherein the intermediate layer comprises the reaction product of an adhesion promoter and the metal.

3. The semiconductor device according to claim 2, wherein the adhesion promoter comprises a silane-based organic.

4. The semiconductor device according to claim 3, wherein the silane-based organic is selected from the group consisting of 3-aminopropyltriethoxysilane and 3-methacryloxypropyltrimethoxysilane.

5. The semiconductor device according to claim 3, wherein the silane-based organic compound comprises a vinyl, chloropropyl, epoxy, diamine, mercapto and/or cationic stryryl organofunctional group.

6. The semiconductor device according to claim 1, wherein the intermediate bonding layer consists essentially of an adhesion promoter, the reaction product of the metal and the adhesion promoter, and the reaction product of the adhesion promoter and the dielectric material.

\* \* \* \* \*